United States Patent
Ranish

(10) Patent No.: US 10,083,827 B2
(45) Date of Patent: Sep. 25, 2018

(54) SIMPLIFIED LAMP DESIGN

(71) Applicant: Applied Materials, Inc., Santa Clara, CA (US)

(72) Inventor: Joseph M. Ranish, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 656 days.

(21) Appl. No.: 14/199,563

(22) Filed: Mar. 6, 2014

(65) Prior Publication Data

US 2014/0265862 A1 Sep. 18, 2014

Related U.S. Application Data

(60) Provisional application No. 61/787,805, filed on Mar. 15, 2013.

(51) Int. Cl.
| | |
|---|---|
| *H01K 1/40* | (2006.01) |
| *H01K 1/16* | (2006.01) |
| *H01K 1/66* | (2006.01) |
| *H05B 3/00* | (2006.01) |
| *H01L 21/67* | (2006.01) |

(52) U.S. Cl.
CPC ............... *H01K 1/16* (2013.01); *H01K 1/40* (2013.01); *H01K 1/66* (2013.01); *H05B 3/0038* (2013.01); *H05B 3/0047* (2013.01); *H01L 21/67115* (2013.01)

(58) Field of Classification Search
CPC ................................. H01K 1/16; H05B 3/0038
See application file for complete search history.

(56) References Cited

U.S. PATENT DOCUMENTS

| | | | |
|---|---|---|---|
| 2003/0062857 A1 | 4/2003 | Kling | |
| 2003/0076026 A1* | 4/2003 | Trent | H01K 1/66 313/332 |
| 2008/0272695 A1* | 11/2008 | Misiaszek | H01K 1/46 313/570 |
| 2010/0133981 A1 | 6/2010 | Garcia | |

(Continued)

FOREIGN PATENT DOCUMENTS

| | | |
|---|---|---|
| CN | 101425444 A | 5/2009 |
| JP | S48-008982 U | 1/1973 |

(Continued)

OTHER PUBLICATIONS

Japanese Office Action for Application No. 2016-500596 dated Nov. 28, 2017.

(Continued)

*Primary Examiner* — Jimmy Vu
*Assistant Examiner* — Laura Yesildag
(74) *Attorney, Agent, or Firm* — Patterson + Sheridan, LLP

(57) ABSTRACT

Embodiments of the present invention generally relate to simplified, high voltage, tungsten halogen lamps for use as source of heat radiation in a rapid thermal processing (RTP) chamber or other lamp heated thermal processing chambers. Embodiments include a lamp design that includes an external fuse while reducing the number of part and expense of prior art lamps. In addition, embodiments of the lamps described herein provide sufficient rigidity to handle compressive forces of inserting the lamps into a heating assembly base, while maintaining a simplified fuse design.

4 Claims, 10 Drawing Sheets

(56) References Cited

U.S. PATENT DOCUMENTS

2010/0207523 A1    8/2010   Kohlmann et al.
2012/0319576 A1   12/2012   Cseh et al.

FOREIGN PATENT DOCUMENTS

| JP | S49-028369 U | | 3/1974 |
|---|---|---|---|
| JP | 2002042740 A | * | 2/2002 |
| TW | 200905721 A | | 2/2009 |
| TW | 201314734 A | | 4/2013 |
| WO | 2004-040636 A1 | | 5/2004 |

OTHER PUBLICATIONS

International Search Report and Written Opinion dated May 28, 2014 for Application No. PCT/US2014/020256.
Taiwan Office Action dated Dec. 25, 2017 for Application No. 103107661

* cited by examiner

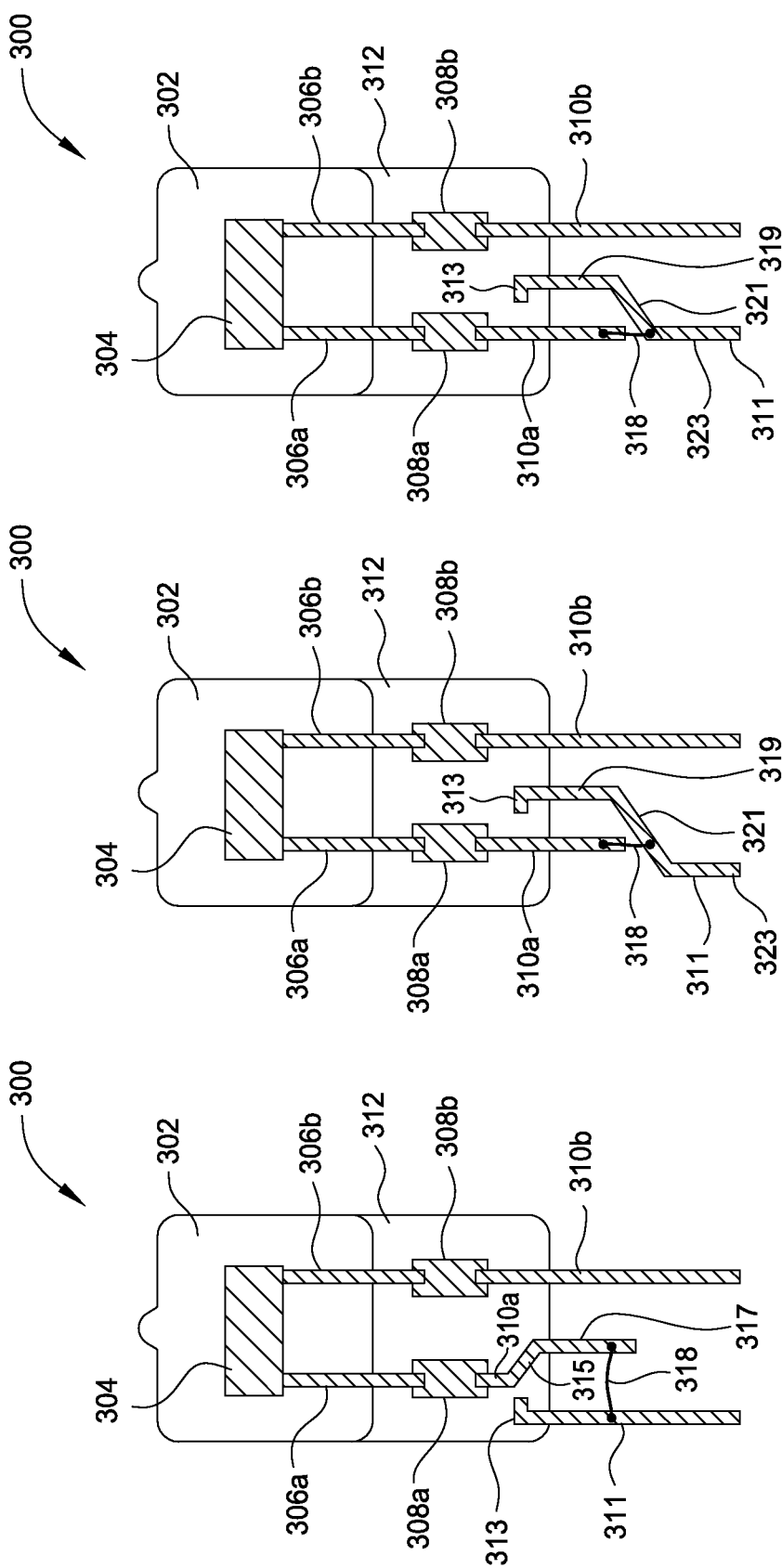

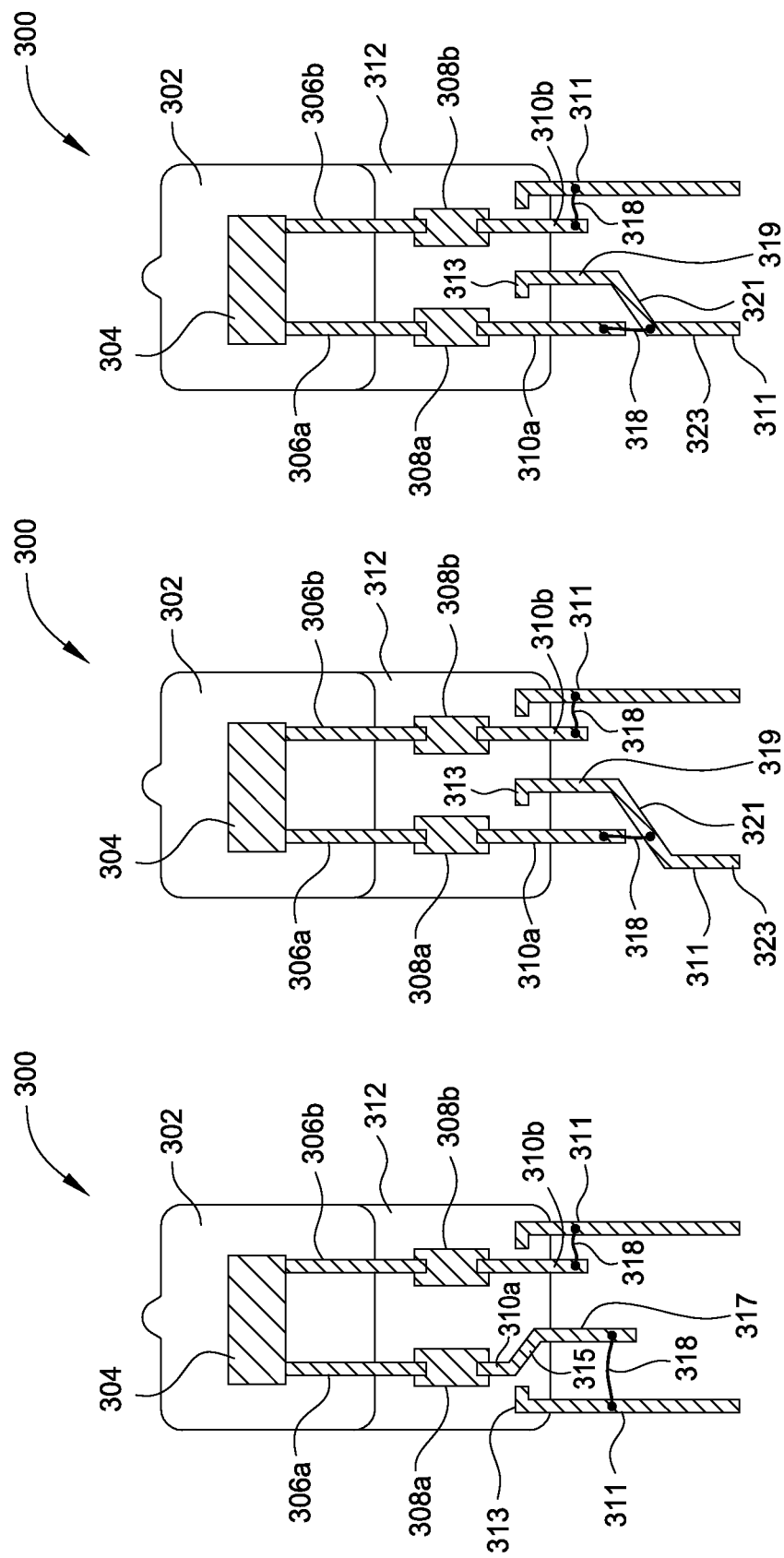

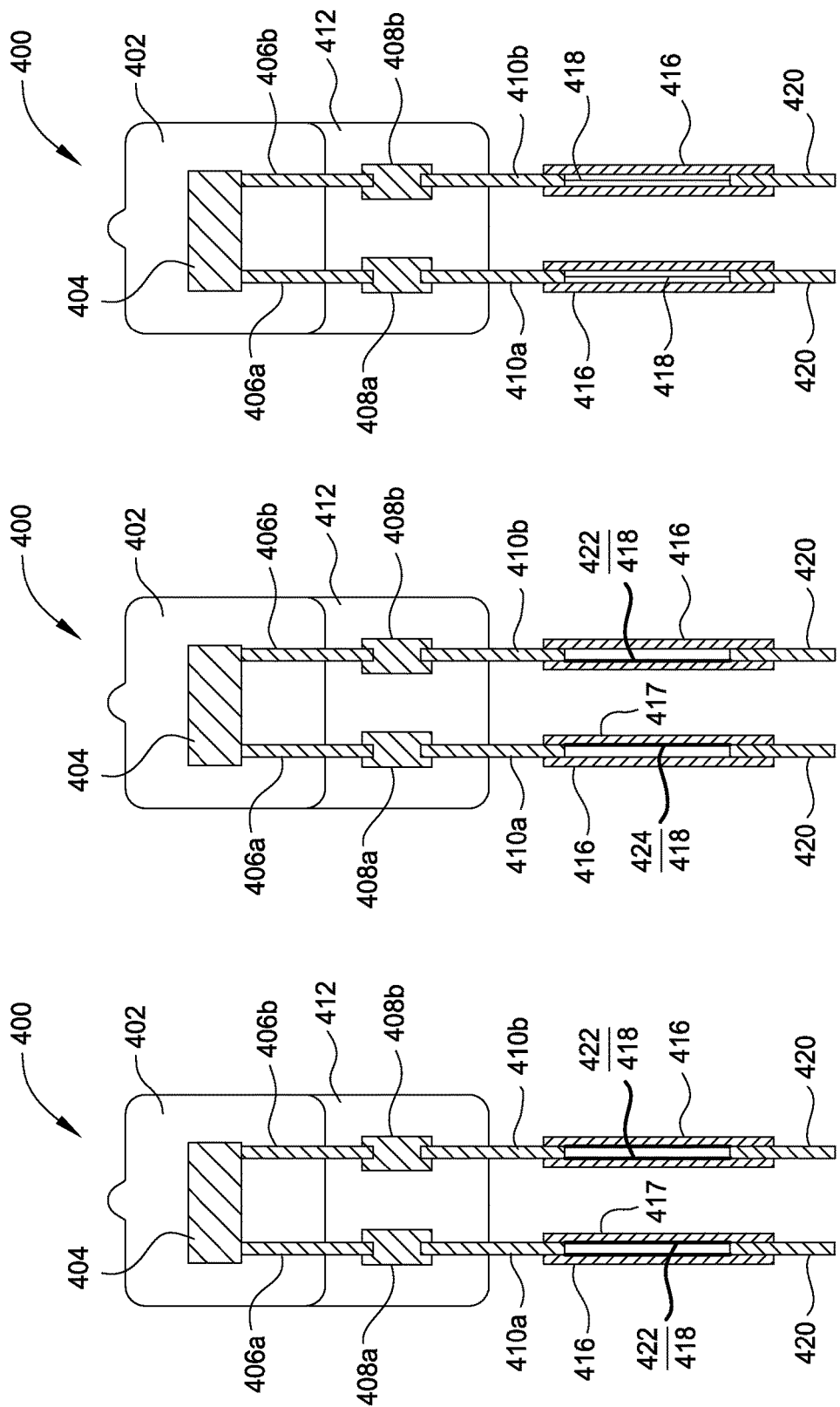

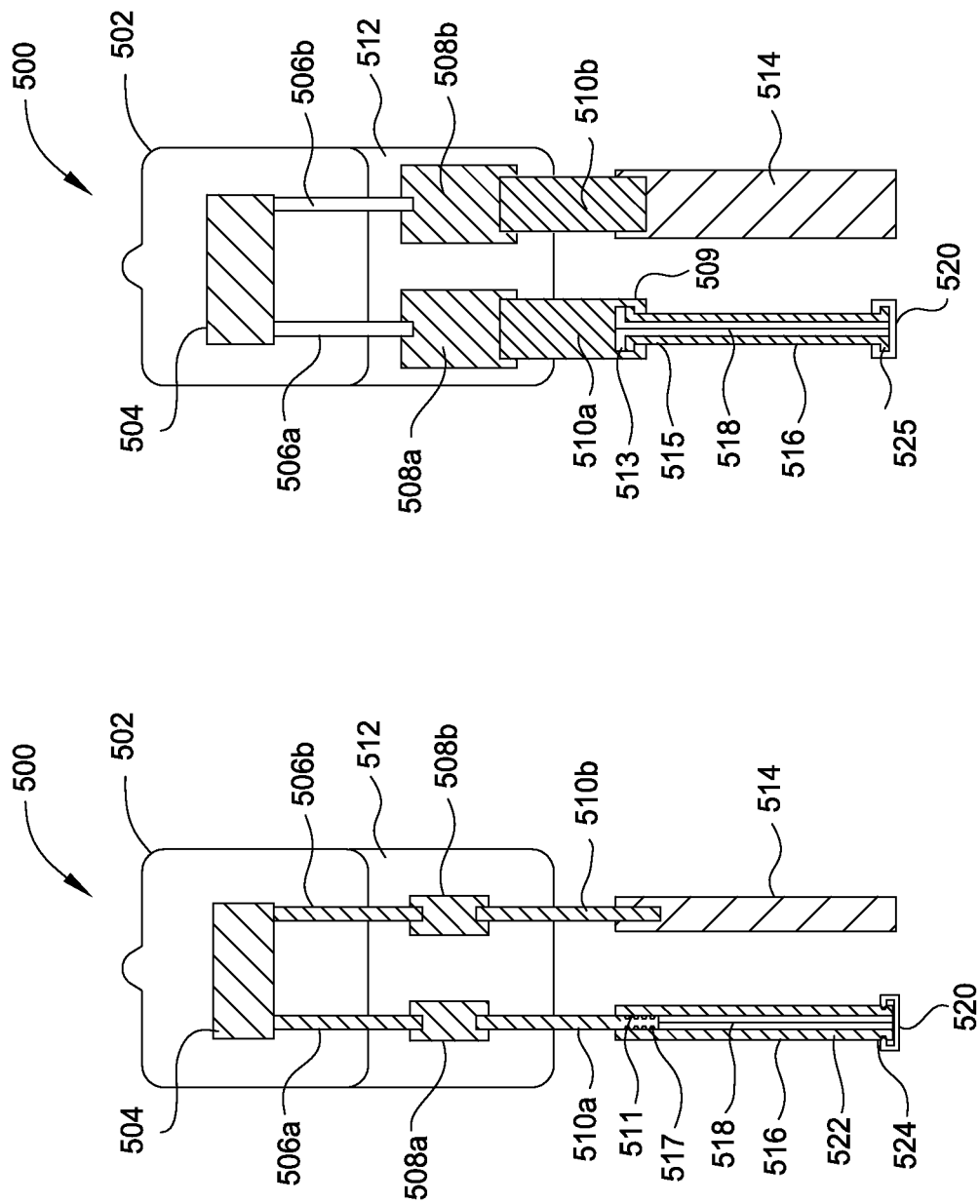

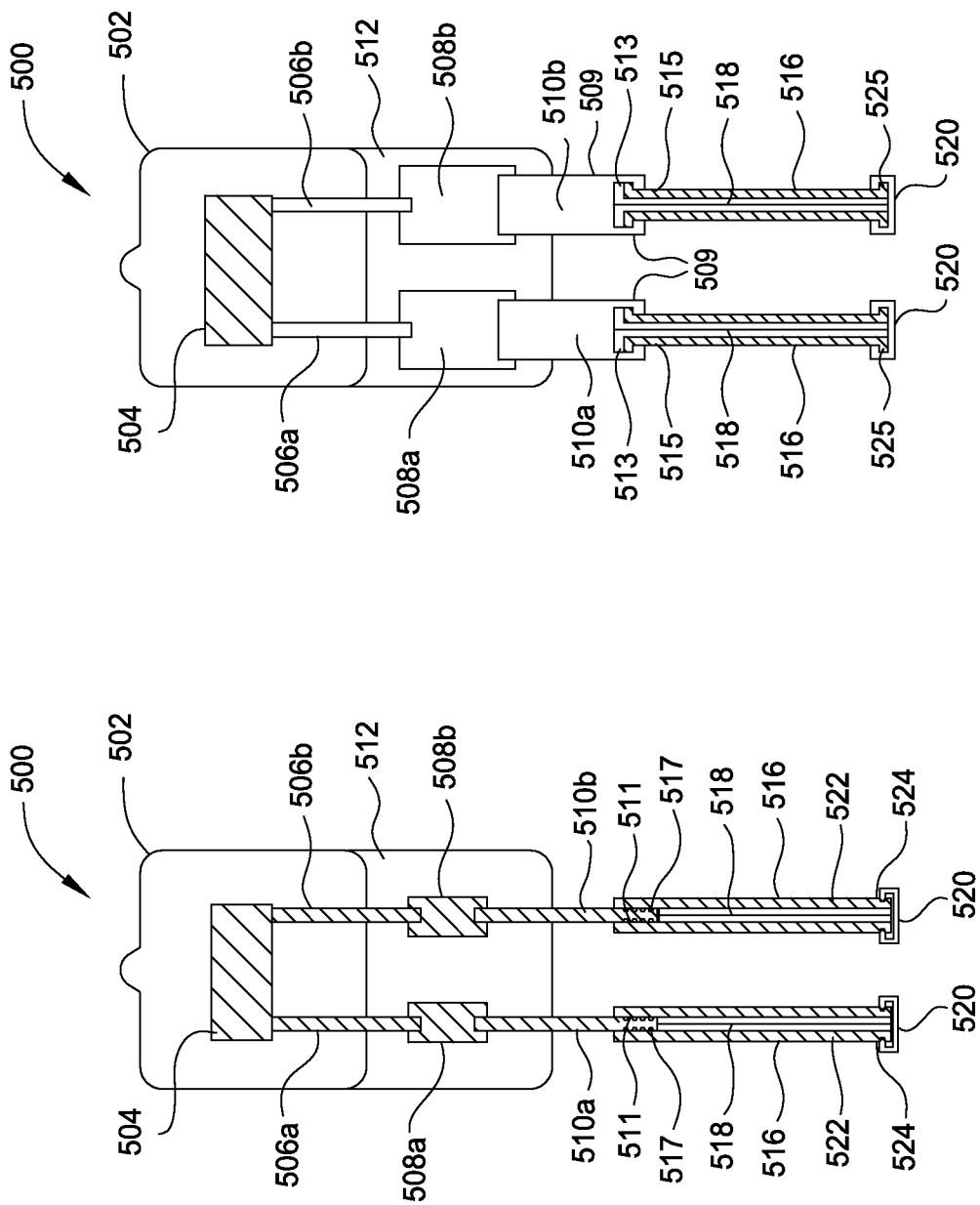

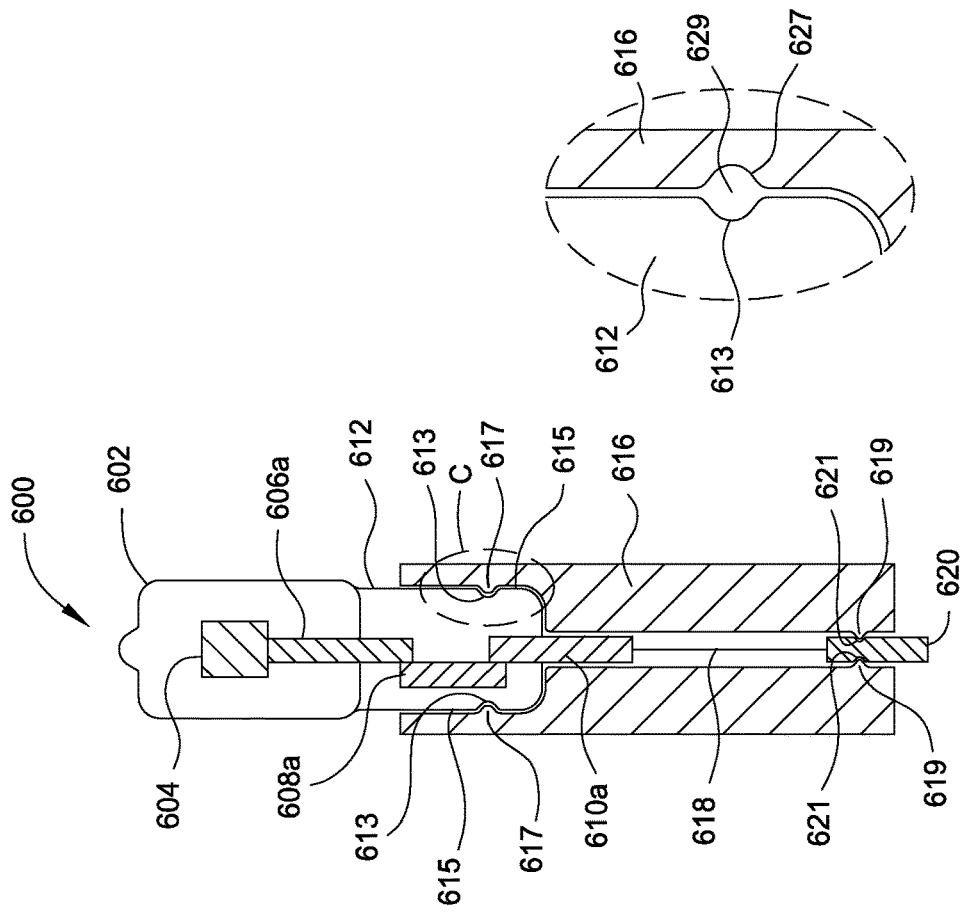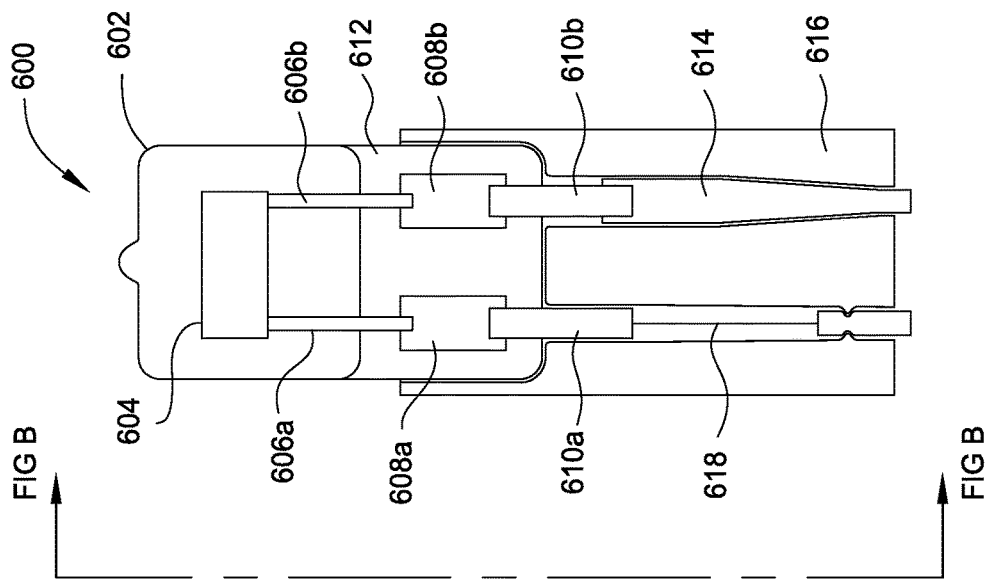

SIMPLIFIED LAMP DESIGN

CROSS-REFERENCE TO RELATED APPLICATIONS

This application claims benefit of U.S. provisional patent application Ser. No. 61/787,805, filed Mar. 15, 2013, which is herein incorporated by reference.

BACKGROUND OF THE INVENTION

Field of the Invention

Embodiments of the present invention generally relate to an apparatus for thermally processing a substrate. In particular, embodiments of the present invention relate to simplified, high voltage, tungsten halogen lamps for use as a source of heat radiation in a rapid thermal processing (RTP) chamber or other lamp heated thermal processing chambers.

Description of the Related Art

During RTP of substrates, thermal radiation is generally used to rapidly heat a substrate in a controlled environment to a maximum temperature of up to about 1350° C. This maximum temperature is maintained for a specific amount of time ranging from less than one second to several minutes depending on the particular process. The substrate is then cooled to room temperature for further processing.

High voltage, e.g., about 40 volts to about 130 volts, tungsten halogen lamps are commonly used as the source of heat radiation in RTP chambers. High voltage tungsten halogen lamps require a fuse in the circuit to prevent arcing and potential explosion in the lamp during lamp failure. Providing the fuse internal to the capsule of the lamp is difficult to implement due to small capsule size and potential contamination affecting the halogen cycle. Providing the fuse in the press seal of the lamp may result in undesirable cracking or breaking of the press seal. Thus, it is desirable to incorporate the fuse external to the capsule and press seal. Current lamp designs include a number of additional components (e.g., stainless steel tube, ceramic potting compound, plugs) in order to provide a fuse external to the capsule and press seal while providing sufficient rigidity to the leads for mating to a heating assembly base of an RTP chamber.

Therefore, it is desirable to provide a simplified, high voltage, tungsten halogen lamp design to reduce cost and provide arc protection during lamp failure.

SUMMARY OF THE INVENTION

In one embodiment of the present invention, a lamp assembly comprises a capsule having a filament disposed therein, a press seal extending from the capsule and configured to hermetically seal the capsule, a first lead and a second lead, a third lead extending from the press seal, and a fuse electrically coupling the third lead to one of the first and second leads external to the press seal and capsule. Each of the first and second leads is electrically coupled to the filament within the press seal and extends from the press seal. The third lead is electrically isolated from the first and second leads within the press seal.

In another embodiment, a lamp assembly comprises a capsule having a filament disposed therein, a press seal extending from the capsule and configured to hermetically seal the capsule, a first lead and a second lead, an insulative sleeve coupled to the first lead external to the press seal, a third lead coupled to the insulative sleeve, and a fuse electrically coupling the first lead to the third lead. Each of the first and second leads is electrically coupled to the filament within the press seal and extends from the press seal.

In yet another embodiment, a lamp assembly comprises a capsule having a filament disposed therein, a press seal extending from the capsule and configured to hermetically seal the capsule, a first lead and a second lead, an insulative sleeve coupled to the press seal, a third lead coupled to the insulative sleeve, and a fuse electrically coupling the first lead to the third lead. Each of the first and second leads is electrically coupled to the filament within the press seal and extends from the press seal. At least the first lead extends into the insulative sleeve.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 3A-3F are schematic depictions of high voltage, tungsten halogen lamp assembly designs according to embodiments of the present invention for use in an RTP chamber, such as the RTP chamber of FIG. 1.

FIGS. 4A-4F are schematic depictions of high voltage, tungsten halogen lamp assembly designs according to embodiments of the present invention for use in an RTP chamber, such as the RTP chamber in FIG. 1.

FIGS. 5A-5D are schematic depictions of high voltage, tungsten halogen lamp assembly designs according to embodiments of the present invention for use in an RTP chamber, such as the RTP chamber in FIG. 1.

FIG. 6A is a top, cross-sectional view, and FIG. 6B is a side, cross-sectional view of a high voltage, tungsten halogen lamp assembly design according to another embodiment of the present invention for use in an RTP chamber, such as the RTP chamber in FIG. 1.

FIG. 6C is a detail view "C" of the engagement between the sleeve and the press seal of FIG. 6A according to another embodiment.

DETAILED DESCRIPTION

Embodiments of the present invention generally relate to simplified, high voltage, tungsten halogen lamps for use as source of heat radiation in a rapid thermal processing (RTP) chamber or other lamp heated thermal processing chambers. Embodiments include a lamp assembly design that includes an external fuse while reducing the number of part and expense of prior art lamps. In addition, embodiments of the lamps described herein provide sufficient rigidity to handle compressive forces of inserting the lamps into a heating assembly base, while maintaining a simplified fuse design.

Figure 1:
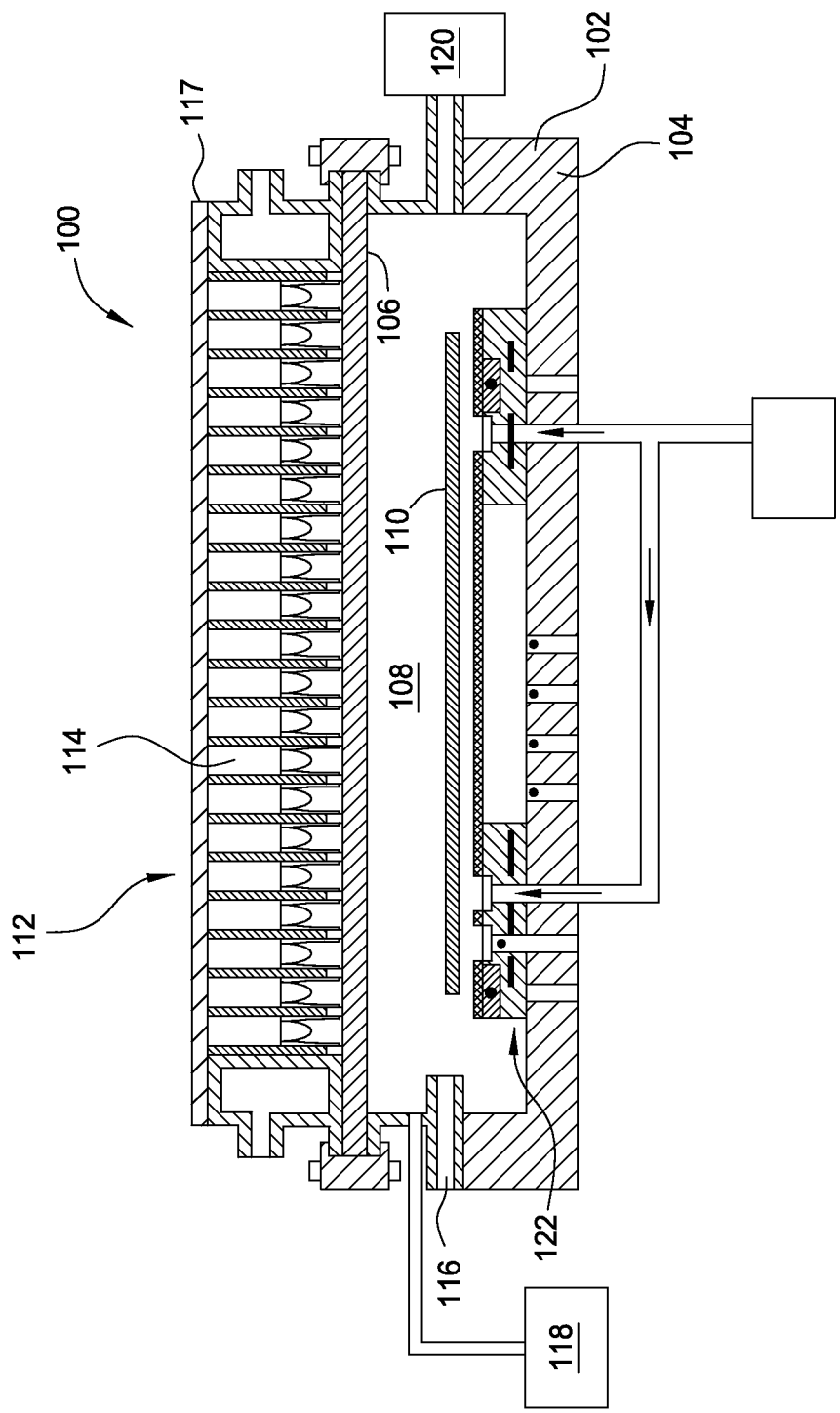
FIG. 1 is a schematic, cross-sectional view of an RTP chamber in which embodiments of the present invention are used.

FIG. 1 is a schematic, cross-sectional view of an RTP chamber 100 in which embodiments of the present invention are used. The RTP chamber 100 includes sidewalls 102, a chamber bottom 104 coupled to the sidewalls 102, and a quartz window 106 disposed over the sidewalls 102. The sidewalls 102, the chamber bottom 104, and the quartz window 106 define an inner volume 108 for processing a substrate 110 therein.

A slit valve door 116 may be formed through the sidewalls 102 for transferring a substrate therethrough. The RTP chamber 100 is coupled to a gas source 118 configured to provide one or more processing gases to the inner volume 108 during processing. A vacuum pump 120 may be coupled to the RTP chamber 100 for pumping out the inner volume 108.

A substrate positioning assembly 122 is disposed in the inner volume 108 and configured to support, position, and/or rotate the substrate 110 during processing. Particularly, the substrate positioning assembly 122 may be a non-contact substrate supporting device using flows of fluid to support, position, and/or rotate the substrate 110.

A heating assembly 112 is disposed above the quartz window 106 and configured to direct thermal energy towards the inner volume 108 through the quartz window 106. The heating assembly 112 includes a plurality of lamps 114, such as high voltage tungsten halogen lamps disposed in a hexagonal pattern and controllable in zones to provide controlled heating to different zones of the inner volume 108. Each of the plurality of lamps 114 is inserted into a heating assembly base 117 for electrical connection to a power supply (not shown).

Figure 2:
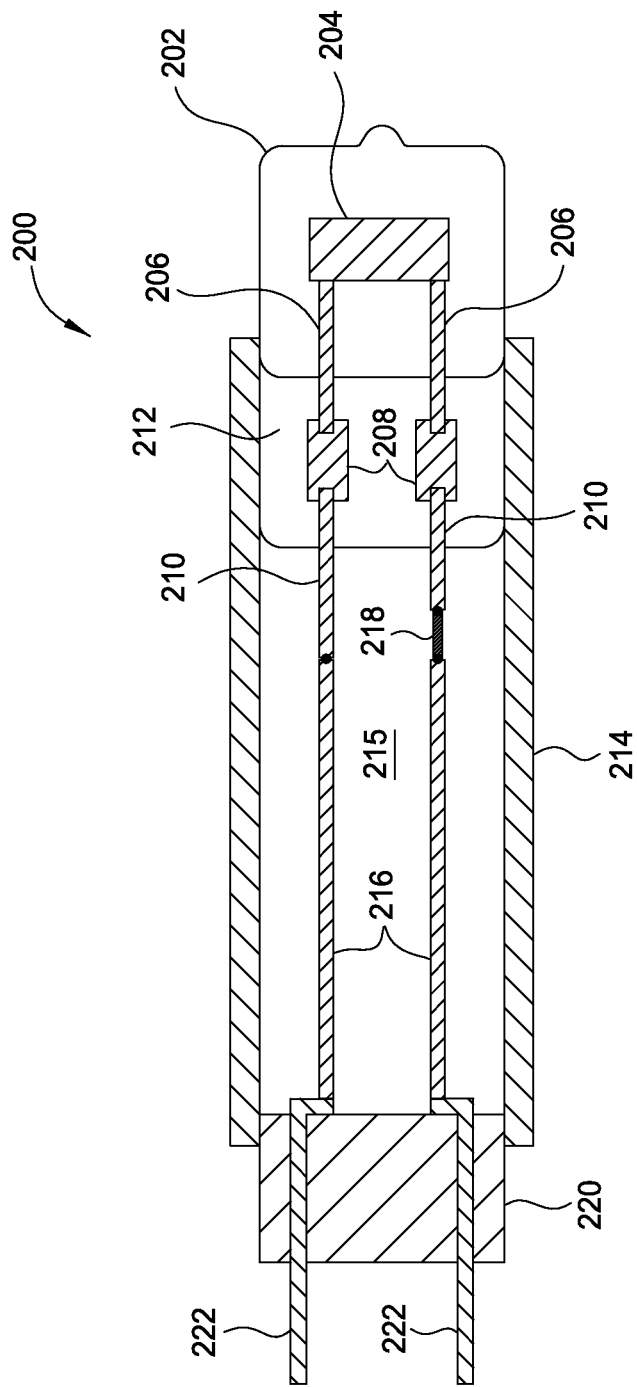
FIG. 2 (prior art) is a schematic, cross-sectional view of a prior art tungsten halogen lamp assembly for use in an RTP chamber, such as the RTP chamber of FIG. 1.

FIG. 2 (prior art) is a schematic, cross-sectional view of a prior art tungsten halogen lamp assembly 200 for use in an RTP chamber such as the RTP chamber 100. The lamp assembly 200 includes a quartz capsule 202 housing a tungsten filament 204. Tungsten leads 206 extend from the filament 204 and are each attached (e.g., welded) to molybdenum foil 208. Molybdenum leads 210 are attached to (e.g., welded) and extend from the molybdenum foil 208. A quartz press seal 212 encapsulates and creates a hermetic seal about the molybdenum foil 208. The molybdenum leads 210 extend out of the press seal 212 for electrical connection.

The press seal 212 and molybdenum leads 210 are inserted into a stainless steel cylinder 214, where the molybdenum leads 210 are connected (e.g., welded) to a conductive pin assembly 216 extending through the cylinder 214. A fuse 218 is serially attached between at least one of the molybdenum leads 210 and the conductive pin assembly 216. The cylinder 214 is then filled with a ceramic potting compound 215, and the end of the cylinder 214 is sealed with a plastic plug 220. The plastic plug 220 has conductive pins 222 extending therethrough and electrically connected to the conductive pin assembly 216. The conductive pins 222 are inserted into a heating assembly base, such as the base 117 from FIG. 1, for connection to a power supply.

The lamp assembly 200 includes features having a number of drawbacks. For example, the lamp assembly 200 has a number of expensive parts, such as the stainless steel cylinder 214 and the plastic plug 220, of which it would be beneficial to eliminate. In addition, the ceramic potting compound provides rigidity to allow the fuse 218 connection to withstand compressive forces of inserting the lamp assembly 200 into a heating assembly base. However, the potting compound is a porous material that can potentially introduce organic contamination into the RTP chamber. Thus, a simplified lamp assembly design eliminating a number of the parts of prior art lamp designs is desirable.

FIGS. 3A-3F are schematic depictions of high voltage, tungsten halogen lamp assembly designs according to embodiments of the present invention for use in an RTP chamber, such as the RTP chamber 100 or other lamp heated thermal processing chambers. The lamp assembly 300 depicted in each of these Figures includes a quartz capsule 302 housing a tungsten filament 304. Tungsten leads 306a, 306b extend from the filament 304 and are each attached (e.g., welded) to molybdenum foil 308a, 308b. Molybdenum leads 310a, 310b are attached to (e.g., welded) and extend from the molybdenum foil 308a, 308b. A quartz press seal 312 encapsulates and creates a hermetic seal about the molybdenum foil 308a, 308b. The molybdenum leads 310a, 310b extend out of the press seal 312.

Each of the lamp assemblies 300 in FIGS. 3A-3B also includes a third lead 311 extending from the press seal 312. Each of the leads 311 includes a hook portion 313 on the end that is encapsulated within the press seal 312 to provide better attachment and stability of the lead 311. In one embodiment, the hook portion 313 is a right angle bend in the lead 311. Each of the third leads 311 is electrically isolated from the leads 310a, 310b within the press seal 312 via the quartz material making up the press seal 312. In addition, each of the lamp assemblies 300 includes a fuse 318 electrically connected between one of the leads 310a, 310b and the lead 311. The fuse 318 composition is from the same family of metals used for lamp fuses, e.g., nickel, zinc, copper, silver, aluminum, and alloys thereof. Although shown as a wire or ribbon, the fuse 318 may include an insulating encasement.

In the embodiment depicted in FIG. 3A, the lead 310a includes a bend 315 within the press seal 312 and a straight portion 317 that extends from the bend 315 through the press seal 312 substantially parallel to the lead 310b. The third lead 311 is slightly offset from the lead 310a and extends from the press seal 312 substantially parallel to the lead 310b. The fuse 318 laterally extends between the lead 311 and the lead 310a, such that the fuse 318 is substantially perpendicular to the lead 311 and the lead 310a.

In the embodiment depicted in FIG. 3B, each of the leads 310a, 310b extend from the press seal 312 substantially parallel to one another. The third lead 311 is embedded in the press seal 312 between the leads 310 and has a first straight portion 319 extending from the press seal 312 substantially parallel to the leads 310a, 310b. The lead 311 includes a bend portion 321 extending from the first straight portion 319 external to the press seal 312. The lead 311 includes a second straight portion 323 extending from the bend portion 321 and substantially parallel to the lead 310b. The fuse 318 extends between the lead 310a and the bend portion 321 of the lead 311.

In the embodiment depicted in FIG. 3C, each of the leads 310a, 310b extend from the press seal 312 substantially parallel to one another. The third lead 311 is embedded in the press seal 312 between the leads 310 and has a first straight portion 319 extending from the press seal 312 substantially parallel to the leads 310a, 310b. The lead 311 includes a bend portion 321 extending from the first straight portion 319 external to the press seal 312. The lead 311 includes a second straight portion 323 extending from the bend portion 321 and substantially parallel to the lead 310b. The second straight portion 323 of the lead 311 is substantially in-line with the lead 310a. The fuse 318 extends between the lead 310a and the second straight portion 323 of the lead 311, such that the lead 310a, the fuse 318, and the second straight portion 323 of the lead 311 are substantially in-line.

Therefore, each of the lamp assemblies 300 depicted in FIGS. 3A-3C, provides for connection between the leads 311, 310b directly into a heating assembly base, such as the heating assembly base 117 while eliminating a number of parts (e.g., stainless steel cylinder, plug, ceramic potting compound) from prior art high voltage, tungsten halogen lamps. In addition, the additional third lead 311 provides the rigidity to absorb the compressive forces applied during insertion of the lamp 300 into the heating base 117 (i.e., prevents the fuse 318 from undergoing compression).

Although FIGS. 3A-3C depict only the lead 310a connected to the fuse 318, either lead 310a or 310b could be connected to the fuse 318. In another embodiment shown in FIGS. 3D-3F, two leads 311 are provided and each of the leads 310a and 310b are electrically coupled to a fuse 318 in substantially the same configurations shown in FIGS. 3A-3C, i.e., both the lead 310b is connected to an additional lead 311 in the same manner as lead 310a is shown connected to the lead 311. Additionally, each of the leads 310b and 311 may be configured to be compatible with external delivery sockets, e.g., mating sockets in a printed circuit board.

FIGS. 4A-4F are schematic depictions of high voltage, tungsten halogen lamp assembly designs according to embodiments of the present invention for use in an RTP chamber, such as the RTP chamber 100 or other lamp heated thermal processing chambers. The lamp assembly 400 depicted in each of these Figures includes a quartz capsule 402 housing a tungsten filament 404. Tungsten leads 406a, 406b extend from the filament 404 and are each attached (e.g., welded) to molybdenum foil 408a, 408b. Molybdenum leads 410a, 410b are attached to (e.g., welded) and extend from the molybdenum foil 408a, 408b. A quartz press seal 412 encapsulates and creates a hermetic seal about the molybdenum foil 408a, 408b. The molybdenum leads 410a, 410b extend out of the press seal 412.

Figure 4C:
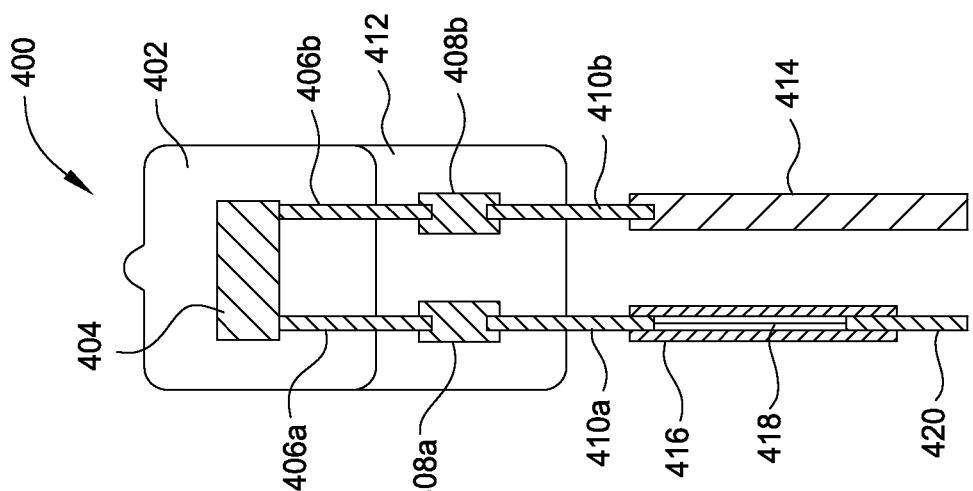
Figure 4B:
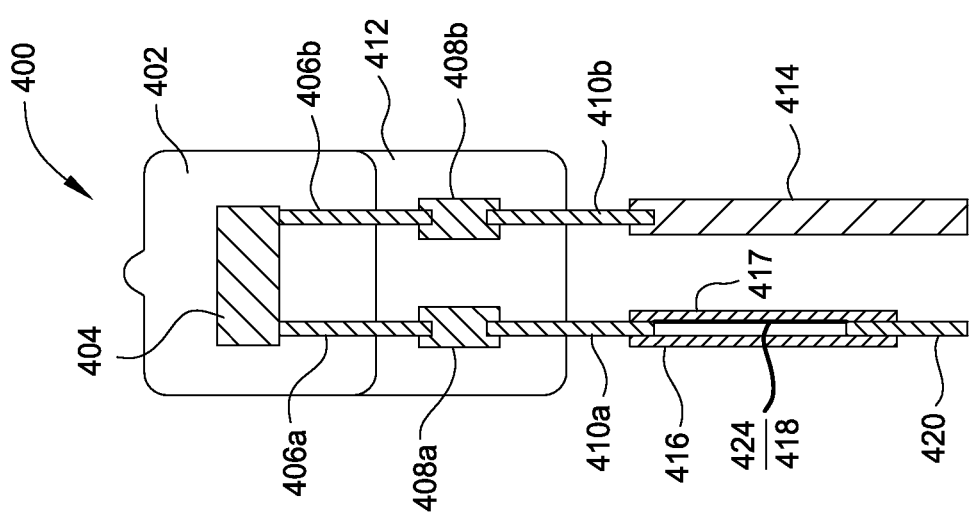
Figure 4A:
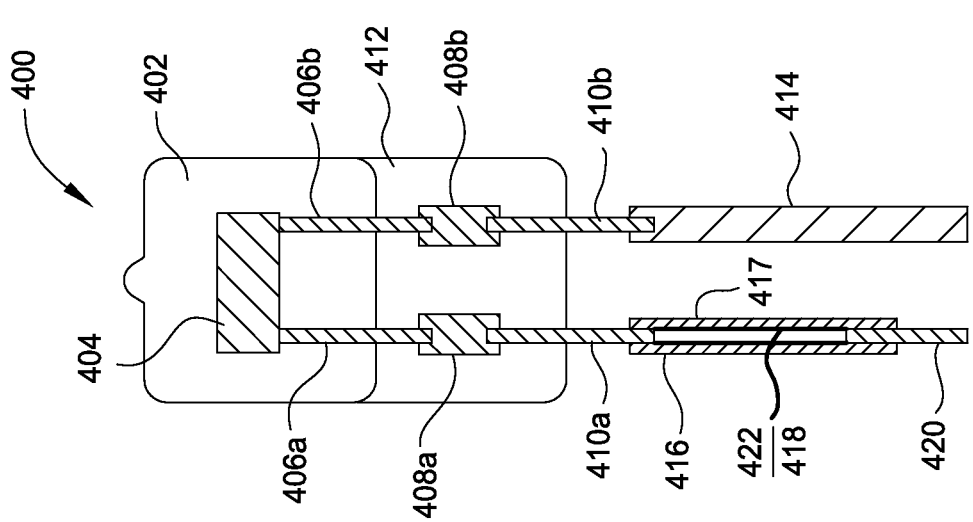

In each of the FIGS. 4A-4C, a conductive pin 414 is attached (e.g., welded) to the lead 410b. In addition, an insulative sleeve 416 (e.g., ceramic or plastic sleeve), a fuse 418, and a conductive pin 420 are attached to the lead 410a. The fuse 418 composition is from the same family of metals used for lamp fuses, e.g., nickel, zinc, copper, silver, aluminum, and alloys thereof. The conductive pin 414, the insulative sleeve 416, the fuse 418, and the conductive pin 420 provide a rigid, conductive extension for inserting the lamp assembly 400 into the heating base 116.

In the embodiment shown in FIG. 4A, the insulative sleeve 416 has a thin metallic layer 422 deposited over the inner surface 417 of the sleeve 416. The equivalent cross-section of the metallic layer 422 (normal to the current flow) approximately corresponds to that of a fuse wire or ribbon designed for this application. Likewise the metallic layer 422 composition is from the same family of metals used for lamp fuses, e.g., nickel, zinc, copper, silver, aluminum, and alloys thereof. The lead 410a and the conductive pin 420 are electrically connected to the metallic layer 422, e.g., soldered or brazed. The thin metallic layer 422 is constructed to act as the fuse 418.

In the embodiment shown in FIG. 4B, the insulative sleeve 416 has a thin metallic trace 424 deposited along one side of the inner surface 417 of the sleeve 416. The lead 410a and the conductive pin 420 are fixed to the sleeve 416 in electrical contact with the trace 424, which acts as the fuse 418. The lead 410a and the conductive pin 420 may be attached to the sleeve 416 using a ceramic compound, a high temperature epoxy, a high temperature phenolic resin, or shrink tubing, for example. The trace 424 can be extended to cover the entire inner diameter for a short axial extent at the top and bottom of the insulative sleeve 416 to permit attachment of the sleeve 416 to the conductive pin 420 and the lead 410a by soldering or brazing.

In the embodiment shown in FIG. 4C, a wire fuse 418 is attached (e.g., welded, soldered) to the lead 410a and extends through the insulative sleeve 416. The fuse 418 is further attached (e.g., welded, soldered) to the conductive pin 420. The lead 410a and the conductive pin 420 may be attached to the sleeve 416 using a ceramic compound, a high temperature epoxy, a high temperature phenolic resin, or shrink tubing, for example. For any of the designs shown in FIGS. 4A, 4B, and 4C, the insulative sleeve 416 may be filled with low melting point glass beads or insulating particles to act as an arc quenching ballotini type fuse.

Therefore, each of the lamp assemblies 400 depicted in FIGS. 4A-4C, provides for connection between the leads 410a, 410b and the conductive pins 414, 420 into a heating assembly base, such as the heating assembly base 117 while eliminating a number of parts (e.g., stainless steel cylinder, plug, ceramic potting compound) from prior art high voltage, tungsten halogen lamps. In addition, the insulative tube configuration provides the rigidity to absorb the compressive forces applied during insertion of the lamp assembly 400 into the heating base 117.

Although each of the FIGS. 4A-4C depict a conductive pin 414 attached to the lead 410b, in an additional embodiment shown in FIGS. 4D-4F, the lead 410b is attached to an additional insulative sleeve 416 (e.g., ceramic or plastic sleeve), an additional fuse 418, and an additional conductive pin 420 in the same manner as shown with regard to lead 410a. Additionally, each of the pins 414 and 420 may be configured to be compatible with external delivery sockets, e.g., mating sockets in a printed circuit board.

FIGS. 5A-5D are schematic depictions of high voltage, tungsten halogen lamp assembly designs according to embodiments of the present invention for use in an RTP chamber, such as the RTP chamber 100 or other lamp heated thermal processing chambers. The lamp assembly 500 depicted in each of these Figures includes a quartz capsule 502 housing a tungsten filament 504. Tungsten leads 506a, 506b extend from the filament 504 and are each attached (e.g., welded) to molybdenum foil 508a, 508b. Molybdenum leads 510a, 510b are attached to (e.g., welded) and extend from the molybdenum foil 508a, 508b. A quartz press seal 512 encapsulates and creates a hermetic seal about the molybdenum foil 508a, 508b. The molybdenum leads 510a, 510b extend out of the press seal 512.

In each of the FIGS. 5A-5B, a conductive pin 514 is attached (e.g., welded) to the lead 510b. In addition, an insulative sleeve 516 (e.g., ceramic or plastic sleeve), a fuse 518, and a conductive cap 520 are attached to the lead 510a. The fuse 518 composition is from the same family of metals used for lamp fuses, e.g., nickel, zinc, copper, silver, aluminum, and alloys thereof. The conductive pin 514, the insulative sleeve 516, the fuse 518, and the conductive cap 520 provide a rigid, conductive extension for inserting the lamp assembly 500 into the heating base 116.

In the embodiment shown in FIG. 5A, the end of the lead 510a has an externally threaded portion 511. The insulative sleeve 516 has a matching internally threaded portion 517, which mates to the externally threaded portion 511 of the lead 510a. The wire fuse 518 is electrically attached (e.g., welded, soldered) to the lead 510a. The fuse 518 is also electrically connected (e.g., welded, soldered) to the conductive cap 520. The cap 520 may be crimped onto the outer surface 522 of the insulative sleeve 516 and engage a groove 524 formed in the outer surface 522 of the sleeve 516 to secure the connection.

In the embodiment shown in FIG. 5B, the end of the lead 510a has a hollow portion 513 that is electrically connected (e.g., welded, soldered) to the fuse 518. The end of the insulative sleeve 516 has a first flange portion 515. The first flange portion 515 of the sleeve 516 is inserted into the hollow portion 513 of the lead 510a, and the walls 509 of the lead 510a are crimped over the first flange portion 515 of the sleeve 516 to secure the connection. The fuse 518 extends through the sleeve 516, and is electrically connected (e.g., welded, soldered) to the cap 520. The cap 520 may be crimped over a second flange portion 525 of the sleeve 516 to secure the connection.

Therefore, each of the lamp assemblies 500 depicted in FIGS. 5A-5B, provides for connection between the leads 510a, 510b and the conductive pin 514 and cap 520 into a heating assembly base, such as the heating assembly base 116 while eliminating a number of parts (e.g., stainless steel cylinder, plug, ceramic potting compound) from prior art high voltage, tungsten halogen lamps. In addition, the insulative tube configuration provides the rigidity to absorb the compressive forces applied during insertion of the lamp assembly 500 into the heating base 116.

Although in each of the FIGS. 5A-5B, a conductive pin 514 is attached to the lead 510b, in an additional embodiment shown in FIGS. 5D-5E, the lead 510b is attached to an additional insulative sleeve 516, an additional fuse 518, and an additional conductive cap 520 in the same manner as shown with respect to the lead 510a. Additionally, each of the pin 514 and the conductive cap 520 may be configured to be compatible with external delivery sockets, e.g., mating sockets in a printed circuit board.

FIG. 6A is a top, cross-sectional view, and FIG. 6B is a side, cross-sectional view of a high voltage, tungsten halogen lamp assembly design according to another embodiment of the present invention for use in an RTP chamber, such as the RTP chamber 100 or other lamp heated thermal processing chambers. The lamp assembly 600 includes a quartz capsule 602 housing a tungsten filament 604. Tungsten leads 606a, 606b extend from the filament 604 and are each attached (e.g., welded) to molybdenum foil 608a, 608b. Molybdenum leads 610a, 610b are attached to (e.g., welded) and extend from the molybdenum foil 608a, 608b. A quartz press seal 612 encapsulates and creates a hermetic seal about the molybdenum foil 608a, 608b. The molybdenum leads 610a, 610b extend out of the press seal 612.

A conductive pin 614 is attached (e.g., welded) to the lead 610b. A fuse 618 is electrically attached (e.g., welded) to the lead 610a. The fuse 618 composition is from the same family of metals used for lamp fuses, e.g., nickel, zinc, copper, silver, aluminum, and alloys thereof. A sleeve 616 is attached to the press seal 612 and has the pin 614 and the fuse 618 extending therethrough. The sleeve 616 may be formed from a plastic material, such as a high temperature plastic. In one embodiment, the press seal 612 has a groove 613 formed in its outer surface 615. A mating extension 617 is formed in the sleeve 616, such that when engaged, the extension 617 snaps into the groove 613, and locks them into place. A conductive pin 620 is press fit into the opposite end of the sleeve 616. The conductive pin 620 has a groove 621 formed therein to match a mating extension 619 formed in the sleeve 616, such that when engaged the extension 619 snaps into the groove 621, and locks them into place. The fuse 618 extends through a hole in the conductive pin 620. The fuse 618 is electrically attached (e.g., welded) to the conductive pin 620.

FIG. 6C is a detail view "C" of the engagement between the sleeve 616 and the press seal 612 according to another embodiment. In this embodiment, the sleeve 616 may be formed from a ceramic material. The sleeve 616 has a groove 627 formed therein to approximately match the groove 613 in the press seal 612. The mating grooves (627, 613) are filled with a sealant material 629, such as ceramic potting material, solder, metal wire, or adhesive, to lock the sleeve 616 and press seal 612 into place. A hole (not shown) may be formed in the sleeve 616 for insertion of the sealant material 629.

Therefore, the lamp assembly 600 depicted in FIGS. 6A-6C, provides for connection between the leads 610a, 610b and the conductive pins 614, 620 into a heating assembly base, such as the heating assembly base 117 while eliminating a number of parts (e.g., stainless steel cylinder, plug, ceramic potting compound) from prior art high voltage, tungsten halogen lamps. In addition, the plastic sleeve configuration provides the rigidity to absorb the compressive forces applied during insertion of the lamp assembly 600 into the heating base 117.

Figure 6D:
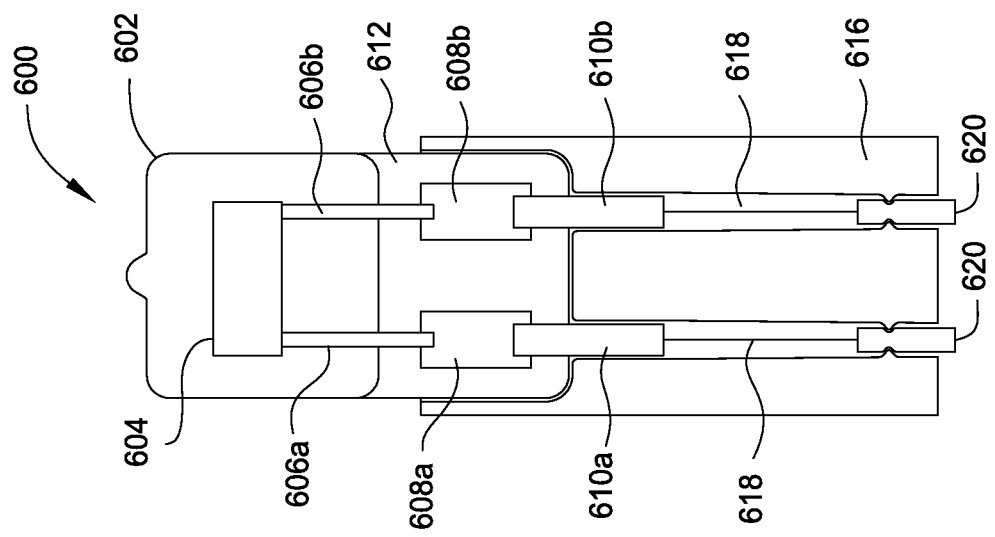
FIG. 6D is a top, cross-sectional view of another embodiment of a high voltage, tungsten halogen lamp assembly design for use in an RTP chamber, such as the RTP chamber in FIG. 1.

Although in each of the FIGS. 6A-6B, a conductive pin 614 is attached to the lead 610b, in an additional embodiment shown in FIG. 6D, the lead 610b is attached to an additional fuse 618 and pin 620 in the same manner as shown with respect to the lead 610a. Additionally, each of the pins 614 and 620 may be configured to be compatible with external delivery sockets, e.g., mating sockets in a printed circuit board.

While the foregoing is directed to embodiments of the present invention, other and further embodiments of the invention may be devised without departing from the basic scope thereof, and the scope thereof is determined by the claims that follow.

The invention claimed is:

1. A lamp assembly, comprising:
a capsule having a filament disposed therein;
a press seal extending from the capsule and configured to hermetically seal the capsule;
a first lead and a second lead, wherein each of the first and second leads is electrically coupled to the filament within the press seal and extends from the press seal;
a third lead extending directly from the press seal, wherein the third lead is electrically isolated from the first and second leads within the press seal, wherein the third lead includes a hook portion comprising a right angle bend within the press seal, and wherein the third lead absorbs compressive force applied to a fuse during installation of the lamp, the fuse positioned external to the press seal and capsule, wherein the fuse electrically couples the third lead to one of the first and second leads.

2. The lamp assembly of claim 1, wherein the first, second, and third leads extend from the press seal substantially parallel to one another.

3. The lamp assembly of claim 1, wherein the first lead includes a bend portion within the press seal and wherein the fuse electrically couples the first lead and the third lead.

4. The lamp assembly of claim 1, wherein the third lead includes a bend portion, and wherein the fuse is attached to the third lead within the bend portion.

* * * * *